United States Patent [19]

Miller et al.

[11] Patent Number: 4,563,675
[45] Date of Patent: Jan. 7, 1986

[54] SYSTEM FOR MONITORING METAL-TO-METAL CONTACT IN ROTATING MACHINERY

[75] Inventors: Robert C. Miller, Penn Hills; James W. Wonn, Hempfield, both of Pa.

[73] Assignee: Westinghouse Electric Corp., Pittsburgh, Pa.

[21] Appl. No.: 451,565

[22] Filed: Dec. 20, 1982

[51] Int. Cl.[4] .............................................. G08B 21/00
[52] U.S. Cl. .................................... 340/679; 73/116; 340/682; 415/118
[58] Field of Search ............... 340/649, 648, 682, 679; 73/116, 660; 415/118

[56] References Cited

U.S. PATENT DOCUMENTS

| | | | |
|---|---|---|---|
| 3,146,434 | 5/1963 | Sharples | 340/679 |
| 3,176,286 | 3/1965 | Oschen | 340/682 |
| 3,183,043 | 5/1965 | Creeger et al. | 308/1 |
| 3,508,241 | 4/1970 | Potter | 308/35 |
| 3,649,787 | 3/1972 | Kasabian | 200/61.45 R |
| 3,677,072 | 7/1972 | Weichbrodt et al. | 73/67 |
| 3,775,680 | 11/1973 | Egeland | 324/65 P |
| 3,897,116 | 7/1975 | Carpenter | 308/1 A |
| 3,904,940 | 9/1975 | Burrus | 340/682 |
| 3,981,621 | 9/1976 | Considine | 417/1 |
| 3,991,413 | 11/1976 | Berger | 340/537 |
| 4,063,786 | 12/1977 | Rall | 308/1 A |
| 4,209,779 | 6/1980 | Beck et al. | 340/683 |
| 4,237,454 | 12/1980 | Meyer | 340/682 |
| 4,262,538 | 4/1981 | Otawara | 73/593 |
| 404,502,046 | 2/1985 | Wonn et al. | 340/679 X |

Primary Examiner—James L. Rowland
Assistant Examiner—Jeffery A. Hofsass
Attorney, Agent, or Firm—D. Schron

[57] ABSTRACT

A rub detector for rotating machines such as turbines wherein a grounding arrangement for the turbine rotor is monitored to detect coincidence between a rotor potential discharge and resulting current flow through the grounding arrangement. In the absence of such coincidence, a rub is suspect. In another arrangement in which a grounding strap is utilized, the strap is elevated from ground by means of a diode arrangement and the rotor voltage is monitored and compared with a predetermined reference which may not be exceeded. If the reference potential is attained by the rotor, then the rotor is discharged such that during cyclical operation, a certain discharge waveform is produced, and which waveform is modified in the presence of a rub condition. Means are also provided for imparting a potential to the rotor during initial start-up conditions.

18 Claims, 12 Drawing Figures

SYSTEM FOR MONITORING METAL-TO-METAL CONTACT IN ROTATING MACHINERY

BACKGROUND OF THE INVENTION

1. Field of the Invention

The invention in general relates to monitoring systems, and particularly to apparatus for detecting undesired metal-to-metal contact between a rotary part and a stationary part of a rotary machine.

2. Description of the Prior Art

In rotating machinery a problem often arises wherein the rotating portion of the machinery contacts the stationary portion thus creating an unwanted and potentially dangerous rubbing condition. For example, in a steam turbine various steam seals exist in order to prevent steam leakage between blade rows as well as to prevent leakage where the rotor penetrates the outer cylinder of the turbine. A mechanical or thermal condition may occur whereby distortion or abnormal operation of the turbine parts may cause one or more of the seals or blades of the turbine to rub thus resulting in a potentially dangerous situation.

The presence of a rub will cause certain abnormal vibrations to occur in the turbine and generally a plurality of vibration sensors are mounted at various points on the turbine system to monitor such vibrations. Other techniques for monitoring rubs include the use of particular sensors for detecting the occurrence of acoustic emissions within the metal parts of the turbine, such acoustic emissions being generated as a result of certain abnormal operating conditions.

A problem arises, however, in the use of acoustic emission or vibration sensing techniques in that it is very often impossible to differentiate between a rub condition as opposed to other conditions relative to the turbine rotor, bearing, etc. which may provide signals similar to those provided by a rub condition.

An improved rub detection arrangement which detects modifications of ground current in the discharge path of such machines is described in copending application Ser. No. 383,400, filed June 1, 1982 and now U.S. Pat. No. 4,502,046.

The present invention, which may be used by itself or in conjunction with prior art techniques to determine the presence of an unwanted rub in rotating machinery, is a modification and improvement over the copending case.

SUMMARY OF THE INVENTION

A rotating machine in which rubs are to be detected includes a stationary machine assembly and a rotating assembly that rotates relative to it. By way of an example, the machine may be a turbine in which the rotating assembly is the turbine rotor. During normal operation, a static charge builds up on the rotor and grounding means are normally provided to the rotor to afford the static charge a path to ground. In the present arrangement, means are included for monitoring and providing an output indicative of the electrical potential of the rotor due to the charge build-up and means responsive to the output are provided for indicating whether a discharge of the charge build-up has taken place other than through the grounding means.

In one embodiment, grounding brushes are utilized and means are provided for obtaining an indication of any current discharge through the grounding brushes. In normal operation, the current discharge occurs simultaneously with a static voltage build-up discharge of the rotor which, if unaccompanied by a corresponding current discharge through the brushes is indicative of an alternate contact to ground, and accordingly, a rub.

In another arrangement, a grounding strap is used and is elevated from ground by a diode arrangement having a certain forward conducting bias. The rotor voltage is compared with a predetermined reference and the rotor is caused to discharge when the two voltages are equal. A periodic discharge waveform is examined to see if there are any premature discharges, indicative of a rub condition.

During operating conditions, when there is no static charge build-up, such as when the turbine is on turning gear, means are provided to simulate a charge build-up.

BRIEF DESCRIPTION OF THE DRAWINGS

Similar characters of reference indicate like parts in the several Figures of the drawings.

DESCRIPTION OF THE PREFERRED EMBODIMENT

Figure 1:
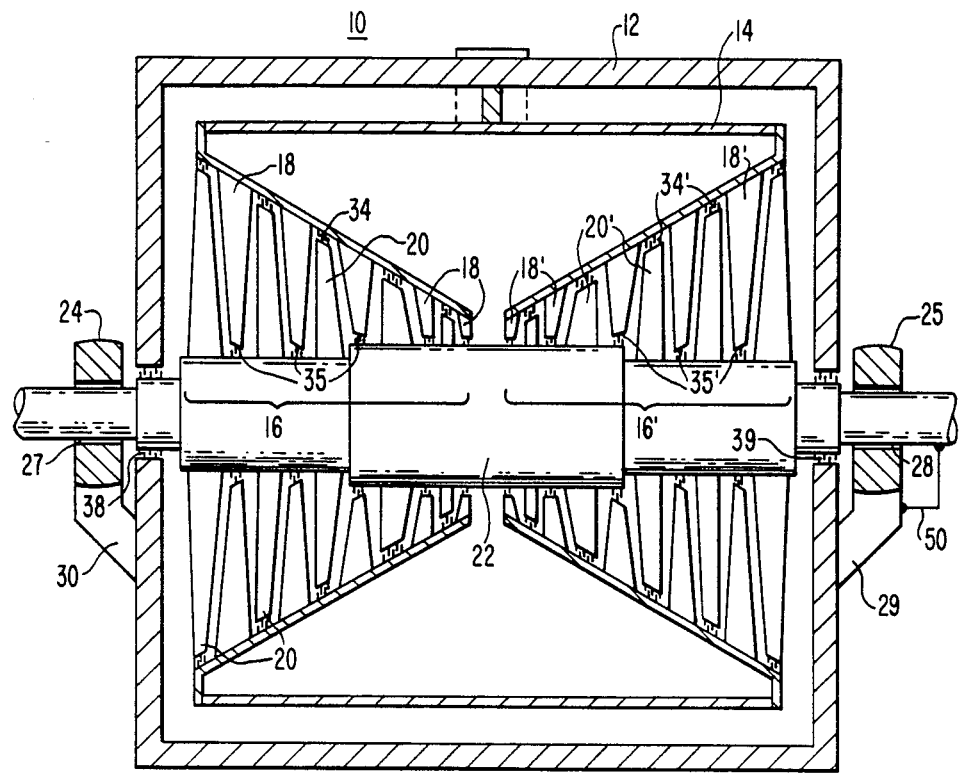
FIG. 1 is a simplified sectional view of a rotating machine in the form of a turbine.

Although the invention is applicable to a variety of rotating machine arrangements, it will be described, by way of example, with respect to a turbine structure, and particularly to a steam turbine as depicted in FIG. 1.

The turbine 10 is comprised of a stationary assembly including an outer casing 12 commonly referred to as an outer cylinder, and an inner structure 14 commonly referred to as an inner cylinder and which is structurally connected to the outer cylinder 12. Various turbine designs may include multiple inner cylinders.

Steam enters the double-flow design depicted and steam expansion simultaneously takes place through turbine blade stages 16 and 16'. Blades 18 (and their primed counterparts) are stationary blades connected to the inner cylinder 14 whereas blades 20 (and their primed counterparts) are connected to rotor 22 and constitute rotor blades.

Rotor 22 is supported at first and second spaced-apart locations by respective bearings 24 and 25 both of which are of the journal-bearing type wherein rotor 22 is supported and rotates on a thin film of oil as depicted by numeral 27 in bearing 24 and by numeral 28 in bearing 25. The bearings themselves are supported on respective pedestal structures depicted by reference numerals 29 and 30.

In order to minimize steam leakage between blade rows, many turbines include some sort of sealing arrangement for the blades. Thus, a labyrinth type seal 34 is illustrated as the steam seal arrangement between the rotor blades 20 and inner casing 14, whereas labyrinth-type seals 35 are illustrated between the stationary blades 18 and rotor 22. Further, seals 38 and 39 are provided at the points where the rotor penetrates the outer cylinder so as to prevent leakage of air into, or steam from, the cylinders.

Due to its operating environment, a rotor 22 tends to build up an electrostatic charge and since the rotor is electrically isolated from the stationary assembly, a potentially dangerous voltage differential may build up across the oil film 27, 28, supporting the rotor. If the electrical rating of the thin film of oil is exceeded, an electric discharge may take place therethrough causing an arc-over which if continued, may result in burning of the lubricating oil, pitting, turbulence, and eventual bearing damage. In order to obviate this potentially dangerous condition, means are generally provided for maintaining the rotor 22 at the same electrical potential, generally ground, as the stationary assembly 12. This is accomplished with the provision of a grounding device 50 electrically connecting the rotor 22 to a pedestal structure 29 (or any other stationary portion of the turbine) so as to establish an electric current discharge path between the rotary and stationary portions of the machine. Typical grounding arrangements are illustrated by way of example in FIGS. 2A and 2B to which reference is now made.

Figure 2A:
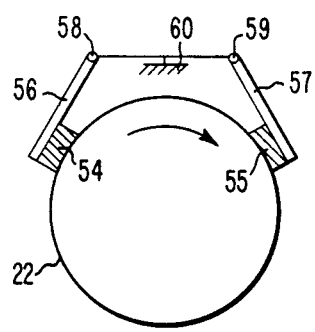
FIGS. 2A and 2B illustrate, in somewhat more detail, typical grounding arrangements for the turbine of FIG. 1.

In FIG. 2A the grounding device is comprised of a pair of electrically conducting brushes 54 and 55 such as carbon-graphite carried by respective metallic brush holders 56 and 57 pivotable around dowels 58 and 59. The brushes are spring-loaded against the rotating shaft 22 and are electrically connected to ground, indicated by numeral 60, so that any electrostatic charge built up in the turbine rotor may be carried to ground through the brushes and their respective holders.

Figure 2B:
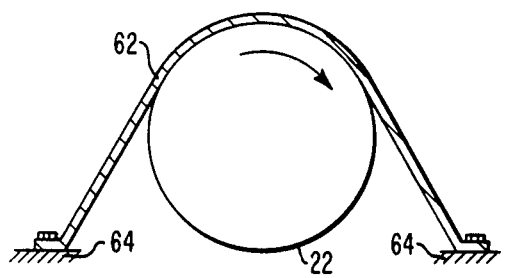

Another type of grounding arrangement is illustrated in FIG. 2B and includes a grounding strap 62 of metallic braid which electrically contacts the rotor 22 as well as ground, indicated by numeral 64.

When a grounding arrangement, such as illustrated in FIG. 2A is utilized, there is an imperfect electrical contact between the rotor and conducting brushes thus resulting in a threshold voltage which must be exceeded before a static discharge occurs. This threshold voltage may vary, it is believed, as a result of a glaze build-up on the brushes due to the operating and environmental conditions. Discharges may also occur at times due to high spots on the rotating shaft which causes better electrical contact to be made.

Upon a normal discharge, the potential of the rotor becomes that of ground with the discharge being accompanied by a current pulse through the brush holder.

If there is a rub, the rotor will be contacting ground through some other discharge path and a rotor potential change will take place without an accompanying current pulse in the brush holder since the current is being conducted to ground elsewhere in the turbine. Accordingly, the arrangement of FIG. 3 monitors both rotor voltage and brush current to determine if there is coincidence between the rotor discharge and the brush holder current since the absence of such coincidence would be indicative of a rub condition.

Figure 3:
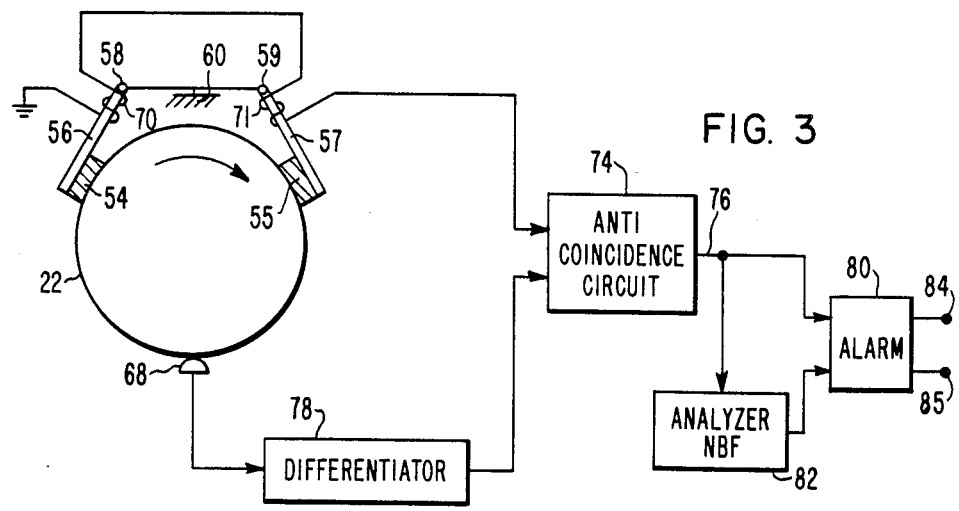
FIG. 3 illustrates the grounding arrangement of FIG. 2A in conjunction with one embodiment of the present invention.

In FIG. 3, a contact 68 is provided for monitoring the rotor potential and is physically touching the rotor. Means are also provided for sensing the brush current, such means taking the form of current transformers 70 and 71 serially arranged and operable to provide an output pulse upon a rotor discharge, and in the absence of a rub.

Means are provided for detecting the simultaneous occurrence of a discharge and consequent current pulse, such means taking the form of an anti-coincidence circuit operable to provide, on output line 76, an output pulse if, and only if, the two input conditions are not simultaneous. A differentiator 78 is included so as to provide circuit 74 with a pulse input indicative of the rotor potential discharge.

Figure 4A:
FIGS. 4A and 4B are waveforms illustrating two different rub conditions.
Figure 4B:

The output signal on line 76 may be provided to some sort of utilization device which would inform an operator of a potential rub condition. In the arrangement of FIG. 3, the anti-coincidence output signal is provided to an alarm circuit 80 as well as to an analyzer device 82. If a rub condition occurs, there is a high probability that during the initial stages of the rub, the output of circuit 74 will be synchronous with the rotor rotation. For example, FIG. 4A illustrates the output of anti-coincidence circuit 74 for one particular rub condition wherein a single output pulse is provided at the same point in each revolution. FIG. 4B illustrates a rub situation wherein three pulses are provided during each revolution of the rotor, with the pulses occupying their respective positions for each revolution. Analyzer 82 of FIG. 3 therefore may be operative to examine pulse signals such as in FIGS. 4A and 4B to determine whether or not they are rotor synchronous. In one form, the analyzer may simply be a narrow band filter designed to pass a frequency equivalent to the normal rotor angular speed. The output of analyzer 82 forms a second input to alarm circuit 80 which is operable to provide an output alarm signal either on line 84 or 85 indicating respective moderate and high probabilities of a rub condition. The moderate level probability signal may be provided if the anti-coincidence circuit 74 provides a predetermined number of output signals in a certain time period, whereas the high probability signal would be provided if the analyzer 82 additionally provides an output signal indicative of the rotor synchronous condition.

Figure 5:
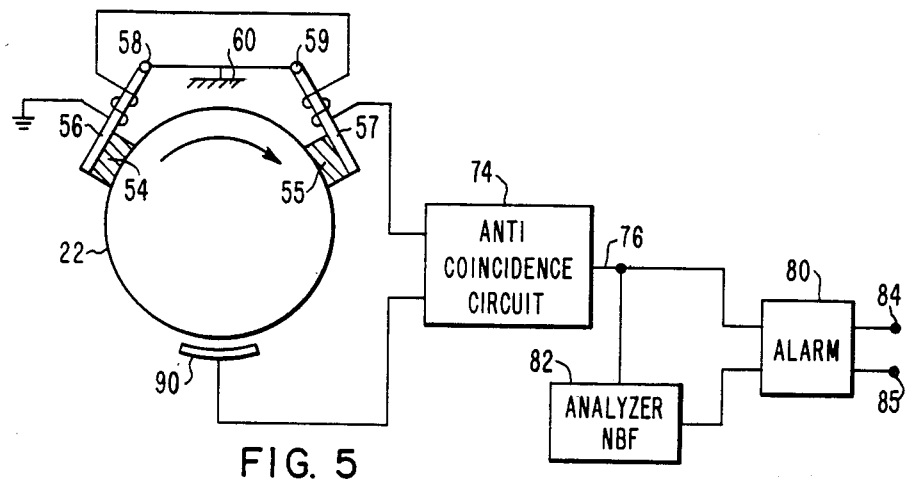
FIG. 5 illustrates a modification of the arrangement of FIG. 3.

FIG. 5 is similar to the arrangement of Figure 3. However, rather than a contact 68 which touches the rotating shaft, the arrangement of FIG. 5 includes a capacitive pick-up 90 which is a non-contacting sensing means and which will automatically provide a pulse input to anti-coincidence circuit upon rotor discharge, thereby eliminating the need for a differentiator.

The glaze build-up is less severe with the grounding strap arrangement of FIG. 2B, however, the problem of a possible rub is still present. The apparatus of FIG. 6 will provide a rub indication for a ground strap arrangement wherein the grounding is modified by the inclusion of diodes 100 to 103 each having a known forward bias voltage $V_b$ which, if exceeded, will cause the diode to conduct. The diode arrangement ensures that the rotor voltage will not exceed $V_b$, considered non-damaging to the oil film.

The rotor voltage signal is fed to a comparator 106 which has, as a second input, a reference voltage $V_{ref}$ of a value less than $V_b$ and which is provided by a voltage source 108. Whenever the rotor voltage equals $V_{ref}$, comparator 106 will provide an output signal to cause the rotor to discharge to ground. In one embodiment, this may be accomplished with the inclusion of a transistor 110 which has its emitter connected to ground, and its collector electrically connected to grounding strap 62 such that when comparator 106 provides an output signal to the base of transistor 110, the transistor will conduct and afford a grounding path for the rotor voltage.

Figure 7A:
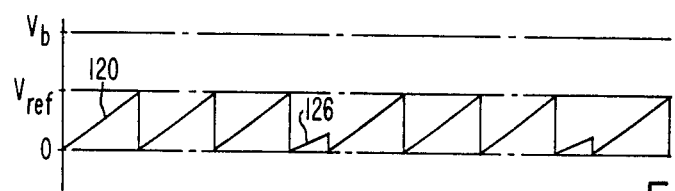
FIGS. 7A and 7B are waveforms illustrating the operation of the arrangement of FIG. 6.
Figure 7B:
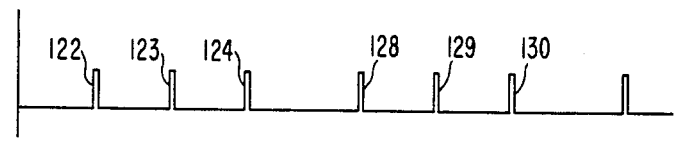

Assuming a relatively uniform source of charge imparted to the rotor, the collector voltage of transistor 110 will be essentially a sawtooth waveform with the peak value of $V_{ref}$ and with a uniform frequency. If a rub occurs, then the rotor output voltage will be reset to ground before attaining a value of $V_{ref}$, thus causing a premature resetting and a modification of the sawtooth waveform. This rub indicative premature resetting is sensed such as by a missing pulse detector 112, any output signal of which may be provided to an alarm circuit or circuits 114 for necessary action. FIGS. 7A and 7B further illustrate the operation.

In FIG. 7A, voltage level $V_b$ represents the diode forward bias level and voltage level $V_{ref}$ represents the lower valued reference voltage. Waveform 120 represents the collector voltage of transistor 110 and is essentially a sawtooth waveform which increases in value until level $V_{ref}$ is attained at which point the comparator 106 turns on the transistor 110 to cause a rotor discharge. In response to this rapid transition from $V_{ref}$ back to zero, the missing pulse detector 112 will internally generate a pulse, as illustrated by waveform 7B, if the discharge goes, for example, from at least 90% of $V_{ref}$ to zero.

FIG. 7B illustrates three pulses 122 to 124 caused by three successive rotor discharges. After the third discharge, it is assumed that a rub occurs such that the sawtooth waveform as indicated by numeral 126 is prematurely reset and will not cause a corresponding pulse to be produced by the missing pulse detector 112. The next three successive discharges will provide corresponding pulses 128 to 130 after which the premature resetting condition will repeat. The missing pulse detector 112 is operable to sense that the period between pulses 124 and 128 is longer than the period between the previous three pulses thereby indicating a premature reset and a rub condition.

With the embodiments of the invention thus far described, it is assumed that the rotor is turning under conditions which would cause the static charge build-up. Such may not be the case when the turbine is initially on turning gear or during start-up when the static charge may be insufficient or non-existent. In order to be able to detect a rub during these start-up conditions, the apparatus includes means for imparting a simulated rotor charge. This is accomplished with the provision of a battery 134 in conjunction with a high resistance 135 which provides a source of charge to one input of comparator 106 when switch 136 is closed. The switch may be subsequently opened when operating conditions are such that the rotor attains a detectable charge potential. The battery, resistor and switch arrangement may also be provided for the embodiment of the invention illustrated in FIG. 3. The embodiment of FIG. 5, however, includes a capacitive pick-up 90 and does not lend itself to the addition of a current source for start-up conditions. Accordingly, an arrangement such as illustrated in Figure 8 may be utilized.

Figure 8:
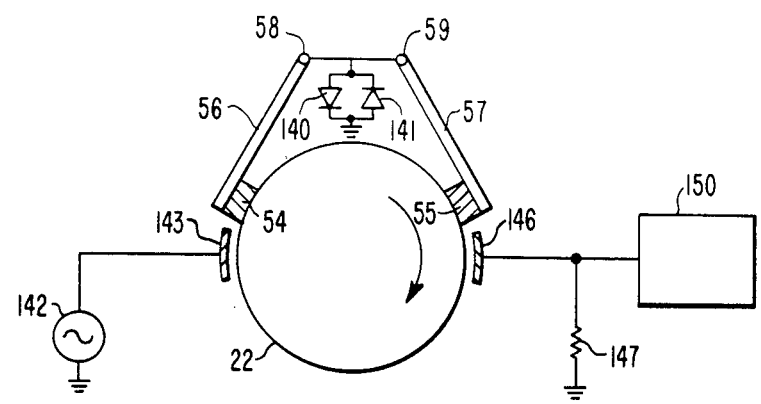
FIG. 8 illustrates yet another embodiment of the invention.

In FIG. 8, grounding brushes 54 and 55 are connected to ground via back-to-back diodes 140 and 141 providing a $V_b$ bias with respect to ground. An AC voltage is imposed upon the rotor 22 by means of an oscillator 142 and capacitive coupling 143, with the peak AC voltage of the oscillator being equal to or less than $V_b$. A capacitive pick-up 146 produces an output voltage across a resistor 147 with the voltage being detected by some utilization means 150 such as an alarm. If a rub should occur in the system, the output voltage across resistor 147 will decrease, and if the decrease exceeds a predetermined threshold, an alarm will be given.

Figure 9:
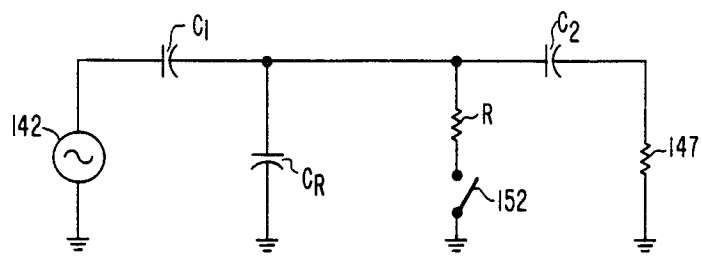
FIG. 9 is an equivalent electrical circuit for the arrangement of FIG. 8.

FIG. 9 illustrates, to a good approximation, the equivalent circuit for the arrangement of FIG. 8. The capacitive coupling 143 is represented by capacitor $C_1$ while the capacitive pick-up 146 is represented by capacitor $C_2$. Capacitor $C_R$ represents the capacitance between the rotor and ground. The capacitive voltage divider thus presented will produce some output voltage level across resistor 147. If a rub should occur, the equivalent condition may be represented by resistance R which is connected to ground by closing switch 152. The path afforded to ground by resistor R thereby will decrease the voltage across resistance 147 such that the amplitude change, as well as any phase change, will be detected.

Figure 6:
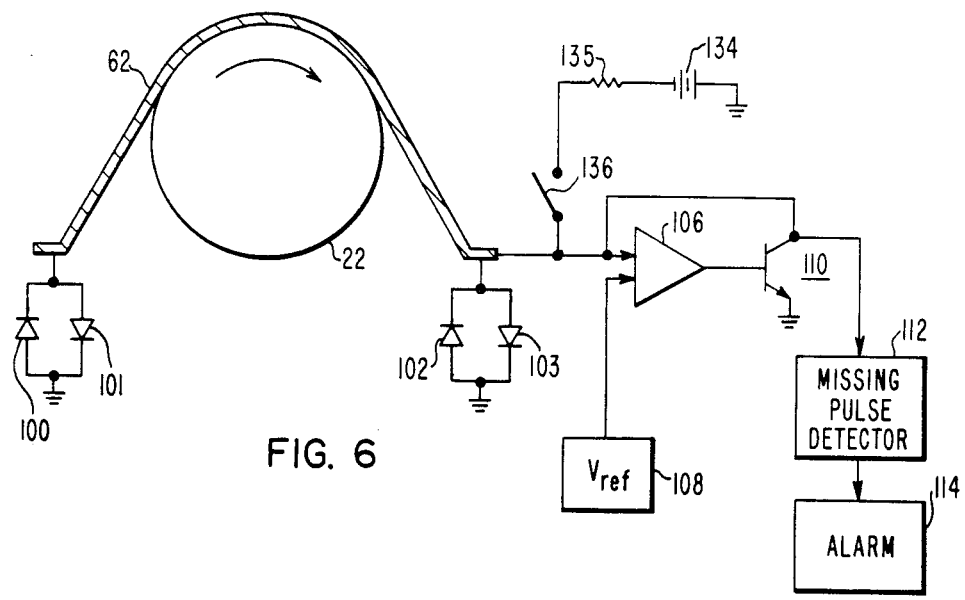
FIG. 6 illustrates the grounding arrangement of FIG. 2B together with another embodiment of the present invention.

Although FIG. 8 illustrates the capacitive coupling and capacitive pick-up in conjunction with grounding brushes, the arrangement may also be used with a grounding strap suitably elevated from ground by means of diodes, such as was illustrated in FIG. 6.

We claim:
1. Apparatus for detecting rubs in rotating machinery comprising:
   (A) a stationary machine assembly;
   (B) a rotating assembly, rotatable relative to said stationary assembly and subject to an electrical charge build-up during rotation;
   (C) grounding means connecting said rotating assembly to ground potential for conducting discharge current when said electrical charge is discharged;
   (D) voltage monitoring means for sensing the electrical potential of said rotating assembly for providing an indication of said discharge; and
   (E) means for determining coincidence between said indication of discharge provided by said voltage monitoring means and said discharge current through said grounding means, the absence of said coincidence being indicative of an alternate path to ground of said electrical charge, other than through said grounding means.
2. Apparatus according to claim 1 wherein:
   (A) said grounding means includes at least one grounding brush, and an electrically conducting arm connecting said brush to ground potential; and which includes,
   (B) means operatively connected to said arm for providing an indication of the current therethrough.
3. Apparatus according to claim 2 which includes:
   (A) circuit means responsive to said current indication and to said indication of discharge provided by said voltage monitoring means for providing an output indicative of their coincidence or non-coincidence.
4. Apparatus according to claim 3 wherein:
   (A) said voltage monitoring means includes a pick-up which contacts said rotating assembly; and which includes

(B) differentiator means connected to said pick-up so as to provide a pulse output signal indicative of said discharge;
(C) said pulse output signal being provided to said circuit means.

5. Apparatus according to claim 3 wherein:
(A) said voltage monitoring means includes a non-contacting pick-up capacitively coupled to said rotating assembly.

6. Apparatus according to claim 3 which includes:
(A) alarm means for receiving said output of said circuit means to provide an alarm indication under predetermined conditions.

7. Apparatus according to claim 6 which includes:
(A) analyzer means for receiving and analyzing said output of said circuit means for providing an additional signal to said alarm means.

8. Apparatus according to claims 1, 2, 3 or 6 wherein:
(A) said stationary machine assembly and said rotating assembly are part of a turbine installation and wherein said rotating assembly is the turbine rotor.

9. Apparatus for detecting rubs in rotating machinery comprising:
(A) a stationary machine assembly;
(B) a rotating assembly, rotatable relative to said stationary assembly and subject to an electrical charge build-up during rotation;
(C) a grounding strap contacting said rotating assembly;
(D) diode means connecting said grounding strap to ground potential, said diode means having a forward bias potential $V_b$;
(E) a source of reference potential of a value $V_{ref} < V_b$;
(F) comparison means for comparing the electrical potential of said rotating assembly with said reference potential and for providing an output indication when equivalent;
(G) means for discharging said electrical charge build-up in response to said output indication of said comparison means; and
(H) means for monitoring said output indication to detect any abnormality in the frequency thereof, said abnormality being indicative of an alternate discharge path to ground, other than through said means for discharging.

10. Apparatus according to claim 9 which includes:
(A) circuit means providing a path to ground when in a conducting condition;
(B) said comparison means being connected to said circuit means to place it into said conducting condition when said output indication is provided;
(C) said grounding strap being connected to said circuit means whereby when in said conducting condition said electrical charge build-up will discharge through said circuit means.

11. Apparatus according to claim 10 wherein:
(A) said circuit means is a transistor.

12. Apparatus according to claim 10 wherein:
(A) said means for monitoring monitors the conducting and non-conducting conditions of said circuit means and is operable to provide an output signal indicative of said abnormality.

13. Apparatus according to claim 12 which includes:
(A) alarm means for receiving said output signal to provide an alarm indication under predetermined conditions.

14. Apparatus according to claims 9, 10, 11, 12 or 13 wherein:
(A) said stationary machine assembly and said rotating assembly are part of a turbine installation and wherein said rotating assembly is the turbine rotor.

15. Apparatus according to claims 1 or 9 which includes:
(A) means for imparting an electrical charge build-up on said rotating assembly under operating conditions wherein a sufficient charge build-up may not normally take place.

16. Apparatus for detecting rubs in rotating machinery comprising:
(A) a stationary machine assembly;
(B) a rotating assembly, rotatable relative to said stationary assembly and subject to an electrical charge build-up during rotation;
(C) grounding means connected to said rotating assembly;
(D) diode means connecting said grounding means to ground potential, said diode means having a forward bias potential $V_b$;
(E) an oscillator;
(F) means for capacitively coupling the output of said oscillator to said rotating assembly to impart an electrical charge to said rotating assembly;
(G) voltage sensing means capacitively coupled to said rotating assembly for determining the voltage thereof; and
(H) means for monitoring said voltage provided by said voltage sensing means.

17. Apparatus according to claim 16 wherein:
(A) the amplitude of said output of said oscillator is $V_b$.

18. Apparatus according to claim 16 wherein:
(A) said stationary machine assembly and said rotating assembly are part of a turbine installation and wherein said rotating assembly is the turbine rotor.

* * * * *